(12) United States Patent
Ohtani et al.

(10) Patent No.: US 6,620,660 B2
(45) Date of Patent: Sep. 16, 2003

(54) ACTIVE MATRIX TYPE DISPLAY DEVICE AND METHOD OF MANUFACTURING THE SAME

(75) Inventors: Hisashi Ohtani, Kanagawa (JP); Yasushi Ogata, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/865,545

(22) Filed: May 29, 2001

(65) Prior Publication Data

US 2002/0058362 A1 May 16, 2002

Related U.S. Application Data

(62) Division of application No. 09/252,813, filed on Feb. 19, 1999, now Pat. No. 6,271,543.

(30) Foreign Application Priority Data

Feb. 26, 1998 (JP) ............................................ 10-062281

(51) Int. Cl.⁷ ................................................ H01L 21/00
(52) U.S. Cl. ..................... 438/158; 438/151; 438/159
(58) Field of Search ......................... 438/50, 158, 151, 438/159, 160, 149, 306, 307, 424, 423; 257/72, 59, 763

(56) References Cited

U.S. PATENT DOCUMENTS

| | | | |
|---|---|---|---|
| 5,334,544 A | * 8/1994 | Matsuoka et al. | .. 148/DIG. 118 |
| 5,463,483 A | 10/1995 | Yamazaki | |
| 5,503,731 A | 4/1996 | Konuma et al. | |
| 5,523,257 A | 6/1996 | Yamazaki et al. | |
| 5,541,748 A | * 7/1996 | Ono et al. | .................. 349/138 |
| 5,608,251 A | 3/1997 | Konuma et al. | |
| 5,620,905 A | 4/1997 | Konuma et al. | |
| 5,648,277 A | 7/1997 | Zhang et al. | |
| 5,686,328 A | 11/1997 | Zhang et al. | |
| 5,712,495 A | 1/1998 | Suzawa | |
| 5,736,750 A | 4/1998 | Yamazaki et al. | |
| 5,831,692 A | 11/1998 | Lee | |
| 5,856,689 A | 1/1999 | Suzawa | |
| 5,891,766 A | 4/1999 | Yamazaki et al. | |
| 5,904,514 A | 5/1999 | Konuma et al. | |
| 5,923,961 A | * 7/1999 | Shibuya et al. | ............. 438/149 |
| 5,966,193 A | 10/1999 | Zhang et al. | |
| 5,982,460 A | 11/1999 | Zhang et al. | |
| 5,998,841 A | 12/1999 | Suzawa | |
| 6,004,831 A | 12/1999 | Yamazaki et al. | |
| 6,038,006 A | 3/2000 | Sasaki et al. | |
| 6,077,731 A | 6/2000 | Yamazaki et al. | |
| 6,114,728 A | 9/2000 | Yamazaki et al. | |
| 6,121,652 A | 9/2000 | Suzawa | |
| 6,124,604 A | * 9/2000 | Koyama et al. | ............... 257/59 |
| 6,172,671 B1 | * 1/2001 | Shibuya et al. | ............... 257/59 |
| 6,218,219 B1 | * 4/2001 | Yamazaki et al. | .......... 438/149 |
| 6,338,988 B1 | * 1/2002 | Andry et al. | ................ 438/149 |
| 6,403,407 B1 | * 6/2002 | Andry et al. | ................ 438/151 |
| 6,407,431 B2 | * 6/2002 | Yamazaki et al. | .......... 257/353 |
| 6,429,058 B1 | * 8/2002 | Colgan et al. | ............... 438/158 |

* cited by examiner

Primary Examiner—Carl Whitehead, Jr.
Assistant Examiner—Laura M Schillinger
(74) Attorney, Agent, or Firm—Eric J. Robinson; Robinson Intellectual Property Law Office, P.C.

(57) ABSTRACT

An active matrix type display device having a sufficient auxiliary capacitance and a high aperture ratio is provided. In the device, an auxiliary capacitance (a black mask being in contact with an inorganic layer/the inorganic layer/a pixel electrode being in contact with the inorganic layer) is formed on an interlayer insulating film made of an organic resin film.

15 Claims, 14 Drawing Sheets

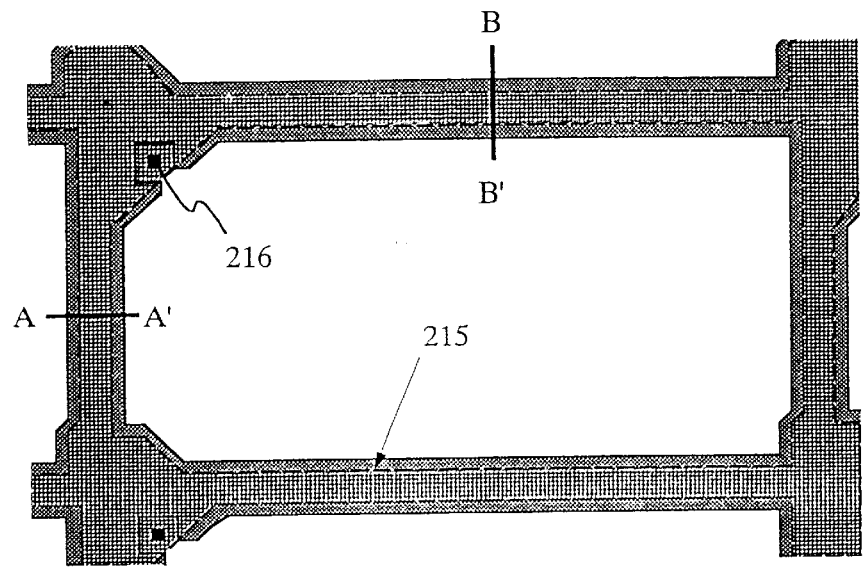
FIG. 6A
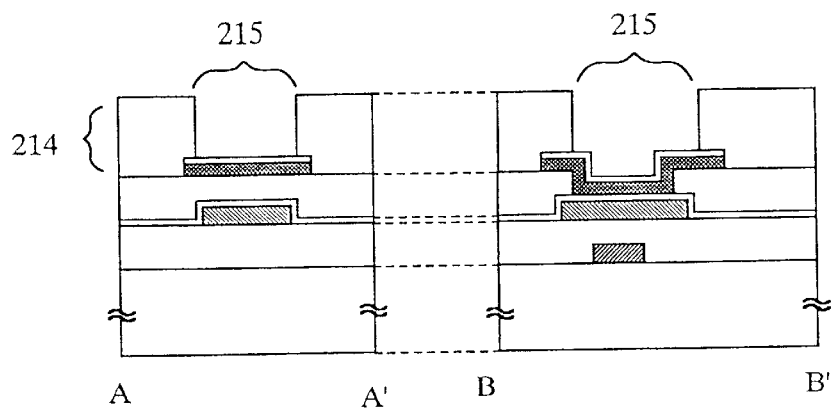
FIG. 6B
FIG. 6C

ACTIVE MATRIX TYPE DISPLAY DEVICE AND METHOD OF MANUFACTURING THE SAME

BACKGROUND OF THE INVENTION

1. Field of the Invention

The present invention relates to a circuit structure of a pixel region of an active matrix type display device using a thin film transistor (TFT), and particularly to a structure of an auxiliary capacitance.

2. Description of the Related Art

In recent years, the demand for an active matrix type liquid crystal display device has been increasing, and a technique for manufacturing a thin film transistor (TFT) using a semiconductor thin film (several tens to hundreds nm in thickness) formed on a substrate having an insulating surface has been rapidly developed.

In the active matrix type liquid crystal display device, a thin film transistor is disposed for each of several tens to millions of pixels arranged in matrix, and an opposite electrode is provided on an opposite substrate for each of pixel electrodes through an intervening liquid crystal so that a kind of capacitor is formed. A voltage applied to each of the pixel electrodes is controlled by the switching function of the TFT and an electric charge to the capacitor is controlled, so that the liquid crystal is driven and the amount of transmitting light is controlled, whereby a picture is displayed.

Since the holding capacitance of the capacitor is gradually decreased by an electric current leak, the amount of transmitting light is changed and deterioration in the contrast of picture display has been caused.

Then, a capacitive wiring line is conventionally provided so that a capacitor (auxiliary capacitance) different from the capacitor with the liquid crystal as a dielectric is disposed in series. This auxiliary capacitance serves to compensate an electric charge lost by the current leak from the capacitor with the liquid crystal as the dielectric.

As typical structures of this auxiliary capacitance, structures using, as a dielectric, (1) a gate insulating film, (2) an interlayer insulating film, and (3) a passivation insulating film are enumerated. Especially, since the structure of (1) has large capacitance per unit, it is often used.

However, conventionally, if an auxiliary capacitance using a capacitive wring line is formed to secure sufficient capacitance, an aperture ratio is lowered. Particularly, in such a small (not larger than 3 inches) and highly fine panel as is used for a projector display device, since a pixel area is small, lowering of the aperture ratio due to the occupied area of the capacitive wiring line has been a problem.

As a phenomenon intrinsic to a display device using a liquid crystal, a light leak occurs from slightly poor orientation of the liquid crystal. Although the liquid crystal is arranged with orientation of some regularity between a pixel electrode and an opposite electrode, there may occur a case that the orientation is disturbed due to roughness of the surface of the electrode, poor rubbing, or the like. The light leak generated in the portion between a region where the orientation of the liquid crystal is disturbed and a region where the orientation of the liquid crystal is normal is called disclination. This disclination lowers display contrast.

As means for preventing this disclination, means for concealing the portion of occurrence of disclination by a black mask (BM) has been adopted. However, since this disclination is generated by a slightly poor orientation of the liquid crystal, it has been difficult to predict the portion of occurrence. Besides, there has been a problem that the aperture ratio is lowered by providing the black mask for concealing the light leak.

SUMMARY OF THE INVENTION

The present invention has been made to solve the foregoing problems and an object of the present invention is to provide an active matrix type display device having a sufficient auxiliary capacitance and a high aperture ratio.

According to a first aspect of the present invention, an active matrix type display device is characterized in that the active matrix type display device includes a pixel electrode and a black mask arranged in matrix over a substrate, a thin film transistor is connected to the pixel electrode, a capacitance is connected to the thin film transistor, and the capacitance is made up of the black mask, an inorganic layer being in contact with the black mask, and the pixel electrode being in contact with the inorganic layer.

According to a second aspect of the present invention, an active matrix type display device is characterized in that the active matrix type display device includes a pixel electrode and a black mask arranged in matrix over a substrate, a thin film transistor is connected to the pixel electrode, a first capacitance and a second capacitance are connected to the thin film transistor, the first capacitance is made up of the black mask, a first inorganic layer on the black mask, and the pixel electrode on the inorganic layer, and the second capacitance is made up of the black mask, a second inorganic layer under the black mask, and a drain electrode under the second inorganic layer.

The active matrix type display device of each of the foregoing aspects is characterized in that the black mask is made of a valve metal.

The active matrix type display device of each of the foregoing aspects is characterized in that the respective inorganic layers constituting the respective capacitances include a film selected from the group consisting of a silicon nitride film, a silicon oxide film, a silicon nitride oxide film, a DLC (diamond-like carbon) film, an aluminum oxide film, a tantalum oxide film, and a titanium oxide film, or a laminated film of these films.

In addition, the active matrix type display device of each of the foregoing aspects is characterized in that an edge of the black mask is taper-shaped.

Incidentally, the active matrix type display device of each of the foregoing aspects is characterized in that the black mask is formed on an organic resin film.

According to a third aspect of the present invention, a method of manufacturing an active matrix type display device comprises a first step of forming a thin film transistor over a substrate having an insulating surface, a second step of forming a first interlayer insulating film to cover the thin film transistor, a third step of forming a second interlayer insulating film to cover the first interlayer insulating film, a fourth step of forming a black mask to cover the second interlayer insulating film, a fifth step of forming an inorganic layer to cover the black mask, a sixth step of selectively removing the black mask and the inorganic layer, a seventh step of forming a third interlayer insulating film to cover the black mask and the inorganic layer, an eighth step of selectively removing the third interlayer insulating film to expose the inorganic layer, and a ninth step of forming a transparent conductive film to cover the third interlayer insulating film, and the method is characterized in that an auxiliary capacitance is formed of the black mask, a pixel electrode, and the inorganic layer as a dielectric.

The method of the third aspect is characterized in that in the fifth step, the inorganic layer includes a film selected from the group consisting of a silicon nitride film, a silicon oxide film, a silicon nitride oxide film, a DLC (diamond-like carbon) film, an aluminum oxide film, a tantalum oxide film, and a titanium oxide film, or a laminated film of these films.

The method of the third aspect is characterized in that in the fifth step, the inorganic layer is formed by anodic oxidation of the black mask made of a valve metal.

According to a fourth aspect of the present invention, a method of manufacturing an active matrix type display device comprises a first step of forming a thin film transistor over a substrate having an insulating surface, a second step of forming a first interlayer insulating film to cover the thin film transistor, a third step of forming a second interlayer insulating film to cover the first interlayer insulating film, a fourth step of forming a black mask made of a valve metal to cover the second interlayer insulating film, a fifth step of selectively removing the black mask, a sixth step of forming an inorganic layer by anodic oxidation of the black mask, and a seventh step of forming a transparent conductive film to cover the inorganic layer, wherein an auxiliary capacitance is formed of the black mask, a pixel electrode, and the inorganic layer as a dielectric.

The method of the fourth aspect is characterized in that in the fifth step, an edge of the black mask is formed into a taper shape.

The method of each of the foregoing aspects is characterized in that the black mask is formed on the second interlayer insulating film made of an organic resin.

BRIEF DESCRIPTION OF THE DRAWINGS

FIGS. 6A to 6C are views of manufacturing steps in embodiment 1;

DETAILED DESCRIPTION OF THE PREFERRED EMBODIMENTS

Figure 1A:
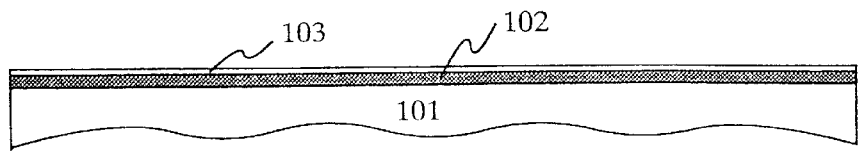
FIGS. 1A to 1E are views showing an example of manufacturing steps of the present invention.
Figure 1B:
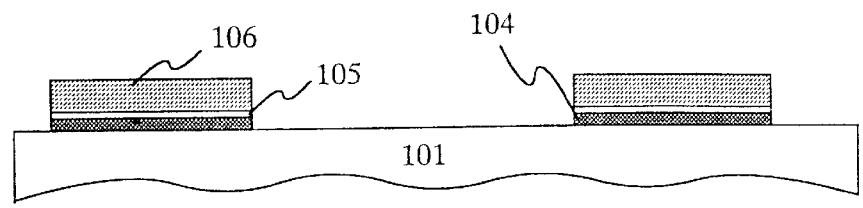

A mode of carrying out the present invention will first be described below with reference to FIG. 1E. For simplification, FIGS. 1A to 1E do not show an insulating substrate, and wiring lines, switching elements and a first interlayer insulating film formed over the substrate, which exist under an interlayer insulating film (second interlayer insulating film) made of an organic resin film. The present invention can be applied for any switching element and any first interlayer insulating film.

The present invention is characterized in that an auxiliary capacitance using an inorganic layer 105, a black mask 104 being in contact with the inorganic layer, and a pixel electrode 109 being in contact with the inorganic layer is formed on an interlayer insulating film made of an organic resin film.

In the structure of the present invention, as the black mask 104, a valve metal or metal material having light shielding properties and conductivity is used. For example, Al, Ta, Ti, Cr, TiN, or the like may be used. The valve metal is such a metal that an anodically formed barrier type anodic oxidation film allows a cathode current to pass through but does not allow an anode current to pass through, that is, shows a valve function (Electrochemical Handbook, fourth edition; Electrochemical Association, p. 370, Maruzen, 1985). As the valve metal, tantalum (Ta), niobium (Nb), hafnium (Hf), zirconium (Zr) and the like are typically enumerated.

With respect to the inorganic film 103, its dielectric constant is important, and an amorphous silicon nitride film, an amorphous silicon oxide film, a silicon nitride oxide film ($SiO_xN_y$), a DLC (diamond like carbon) film, an aluminum oxide film, a tantalum oxide film, a titanium oxide film, a laminated film of these films, and the like may be used. Especially, it is preferable to use the silicon nitride film having a large dielectric constant and capable of being selectively etched.

As the pixel electrode 109, ITO of a conductive film having transparency is used, and a transmission type liquid crystal display device is constructed. As another structure, it is also possible to construct a reflection type liquid crystal display device by using a reflective electrode of Al, Ti or the like as the pixel electrode.

Manufacturing steps of the present invention will next be described with reference to FIGS. 1A to 1E.

First, a flat second interlayer insulating film 101 made of an organic resin, such as BCB (benzocyclobutene), polyimide, or acryl, is formed so as to cover a not-shown TFT and a first interlayer insulating film. In the present invention, the second interlayer insulating film 101 with a thickness of 0.6 to 2 μm is provided to lower parasitic capacitance generated between each signal wiring line and a black mask.

Thereafter, a black mask film 102 being in contact with the surface of the second interlayer insulating film 101 and having a thickness of 50 to 400 nm is formed.

Subsequently, an inorganic film 103 which is in contact with the black mask film 102 and later becomes a dielectric is formed (FIG. 1A).

When the inorganic film 103 is provided, its thickness becomes important. Although it is preferable to reduce the thickness to shorten the distance between electrodes so that sufficient capacitance can be obtained, it is desired that the insulating breakdown voltage of the auxiliary capacitance is at least 20 V or more.

Besides, if the thickness of the inorganic film becomes as thin as 10 to 30 nm, it is difficult to obtain uniform thickness, and occurrence of pinholes or the like is caused.

If the thickness of the inorganic layer becomes large, a step due to the black mask and the inorganic film becomes large, and flattening by using a third interlayer insulating film becomes difficult. Thus, the thickness of the inorganic film is made such that the total of the black mask film and the inorganic film is 700 nm or less, preferably 500 nm or less. However, in the case where an anodic oxidation film is used for the inorganic film and the third interlayer insulating film is not formed, it is not necessary to adopt the above thickness.

Thus, if a silicon nitride film is used as a single layer, a film thickness of at least 50 nm or more is required. Typically, the thickness of the silicon nitride film is made 50 to 300 nm. Preferably, the thickness is made 50 to 200 nm, more preferably, 50 to 100 nm.

When the inorganic film formed by a CVD method or the like is provided on the black mask, if the second interlayer insulating film is exposed on the surface, a gas such as water or methane is generated from the organic resin, so that it is difficult to obtain an excellent silicon nitride film. Although an inorganic film such as a silicon oxide film may be used as the second interlayer insulating film, the inorganic film is required to have such a thickness that parasitic capacitance generated between each signal wiring line and the black mask can be reduced, so that formation of a contact hole becomes difficult, and such a structure is not practical.

In the manufacturing steps of the present invention, the fundamental is that the inorganic film 103 is formed before the black mask film 102 on the second interlayer insulating film is patterned. That is, the steps of the present invention include at least one patterning step (FIG. 1B) after formation of the inorganic film and before formation of the third interlayer insulating film. As a result, it can be realized to prevent a gas from being released from the second interlayer insulating film made of an organic resin. The black mask 104 and the inorganic layer 105 are patterned into substantially the same shape by using a resist 106. However, when an anodic oxidation film is used as the inorganic layer, it is not necessary to adopt the above structure. As an etching method, anisotropic dry etching by RIE or the like is carried out.

Figure 1C:
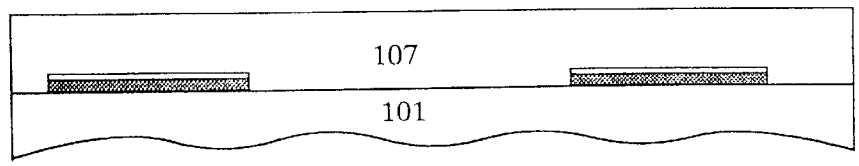

After the patterning step of the black mask and the inorganic film, a third interlayer insulating film 107 is formed (FIG. 1C). However, in the present invention, if an anodic oxidation film is used as the inorganic layer, it is possible to make such a structure that the third interlayer insulating film is not formed.

Figure 1D:
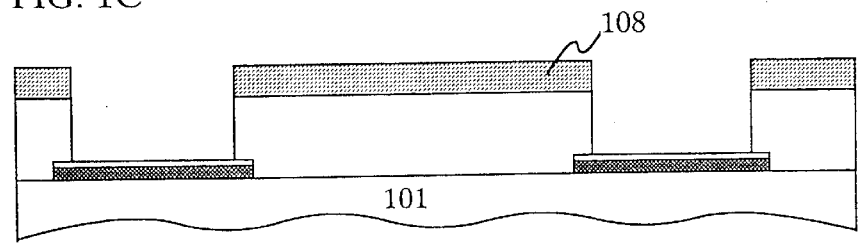

Thereafter, for the purpose of forming an auxiliary capacitance 110, the third interlayer insulating film 107 on the inorganic layer 105 is selectively removed by a dry etching method using a resist 108. By this step, a recess portion is formed, and the inorganic layer 105 is exposed on its bottom. At this time, the inorganic layer 105 is used as an etching stopper (FIG. 1D).

In addition, although not shown, a contact hole for connecting a TFT with a pixel electrode is formed.

Figure 1E:
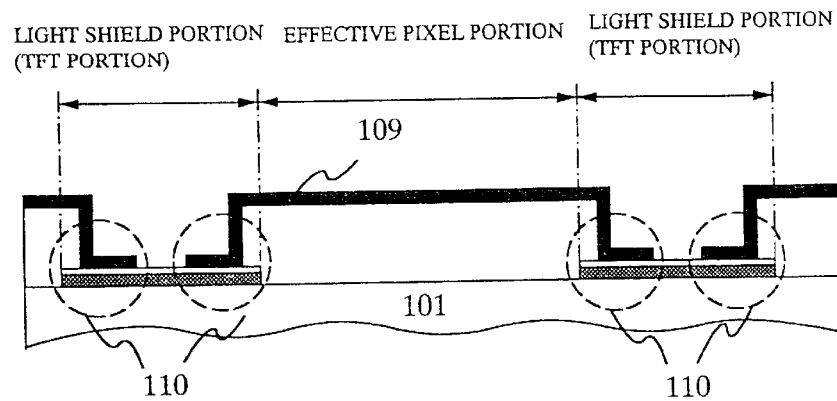

Next, a transparent conductive film (for example, ITO (indium tin oxide)) is formed and is patterned so that a pixel electrode 109 is formed (FIG. 1E).

In the present invention, the inorganic layer 105 is used as a dielectric, and the auxiliary capacitance 110 is formed at a portion where the pixel electrode 109 formed to be in contact with the inorganic layer exposed by the dry etching method overlaps with the black mask 104 being in contact with the inorganic layer.

Normally, the black mask is provided to prevent a switching element from being deteriorated by light. Thus, it is very effective to form the auxiliary capacitance by using this black mask in view of increasing an effective pixel region. Incidentally, the effective pixel region means a region which can actually function as a picture display region. The disclination can also be concealed by the black mask.

In the present specification, the dry etching method is used to remove the interlayer insulating film, and as an etchant, a chlorine-based etchant, fluorine-based etchant, or oxygen-based etchant is suitably used as the need arises.

The chlorine-based etchant as used in the present specification includes chlorine or a gas containing chlorine in part, for example, a single gas or mixed gas of $Cl_2$, $BCl_3$, $SiCl_4$, HCl, $CCl_4$, or the like, and a gas obtained by diluting these single gas or mixed gas with a gas not containing chlorine (for example, $H_2$, $O_2$, $N_2$, etc.).

The fluorine-based etchant as used in the present specification includes fluorine and a gas containing fluorine in part, for example, a single gas or mixed gas of $F_2$, $BF_3$, $SiF_4$, HF, $CF_4$, or the like, and a gas obtained by diluting these single gas or mixed gas with a gas not containing fluorine (for example, $H_2$, $O_2$, $N_2$, etc.).

The oxygen-based etchant as used in the present specification includes a gas containing oxygen, for examples $O_2$, $O_3$, or the like, and a gas obtained by diluting $O_2$, $O_3$ or the like with a gas not containing oxygen (for example, $N_2$, He, etc.).

In the above structure, the explanation has been made on an example in which attention is paid to only the auxiliary capacitance constituted by the black mask 104, the pixel electrode 109, and the inorganic layer 105. The active matrix type display device will be described in more detail with reference to the embodiments set forth below.

Although the preferred embodiments of the present invention will be described below, it is needless to say that the present invention is not limited to these embodiments.
[Embodiment 1]

In this embodiment, steps of manufacturing an auxiliary capacitance on an active matrix array substrate will be described. First, an example in which a TFT is manufactured as a switching element disposed in a pixel will be described with reference to FIGS. 2A to 2D.

Figure 2A:
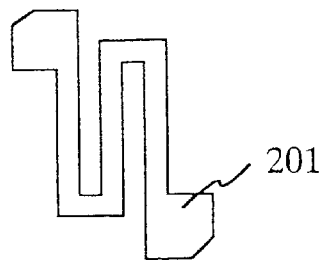
FIGS. 2A to 2D are views of manufacturing steps in embodiment 1.

First, an active layer 201 was formed over a substrate (not shown) having an insulating surface. It is appropriate that the active layer 201 is formed of a crystalline semiconductor film (typically a crystalline silicon film) with a thickness of 20 to 100 nm (preferably 25 to 70 nm) (FIG. 2A).

Although any well-known means may be used as a method of forming the crystalline silicon film, a technique disclosed in Japanese Patent Application Serial No. Hei. 8-335152 was used in this embodiment.

The thus formed crystalline silicon film was patterned to form the active layer 201, and a gate insulating film (not shown) was formed by a plasma CVD method, and then, a thermal oxidation step was carried out to improve interfacial characteristics between the active layer 201 and the gate insulating film. The final thickness of the active layer after the thermal oxidation is made 10 to 75 nm (preferably 15 to 45 nm).

Figure 2B:
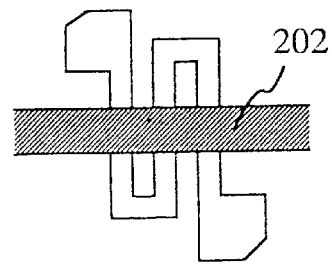

Next, a film of aluminum or a material mainly containing aluminum (an aluminum film containing scandium of 2 wt % in this embodiment) was formed and was patterned to form a gate wiring line 202 (FIG. 2B).

Figure 2C:
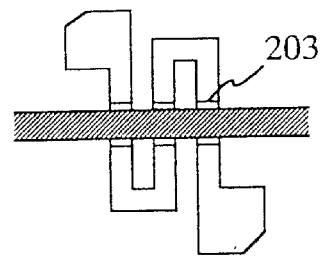

Next, by using a technique disclosed in Japanese Patent Application Laid-open No. Hei. 7-135318, source/drain regions, a channel formation region, and an LDD (Lightly doped drain) region were formed. In this embodiment, the LDD region 203 with a thickness of 0.5 to 1.5 μm (typically 0.7 to 1 µm) was formed between the source/drain regions and the channel formation region (FIG. 2C).

Next, an impurity element (element in group 13 or group 15) added in the active layer was activated by heat annealing, and then, a first interlayer insulating film (not shown) covering the gate wiring line 202 was formed. Further, contact holes 204 and 205 were formed in the first interlayer insulating film, and a source wiring line 206 and a drain electrode 207 were formed.

Figure 2D:
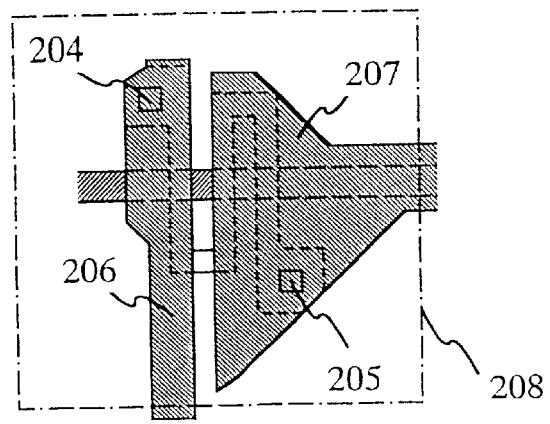

In this embodiment, as the source wiring line 206 and the drain electrode 207, a three-layer laminated structure of titanium/aluminum/titanium is used. It is appropriate that the thickness is made 150/500/100 nm (FIG. 2D).

Figure 3A:
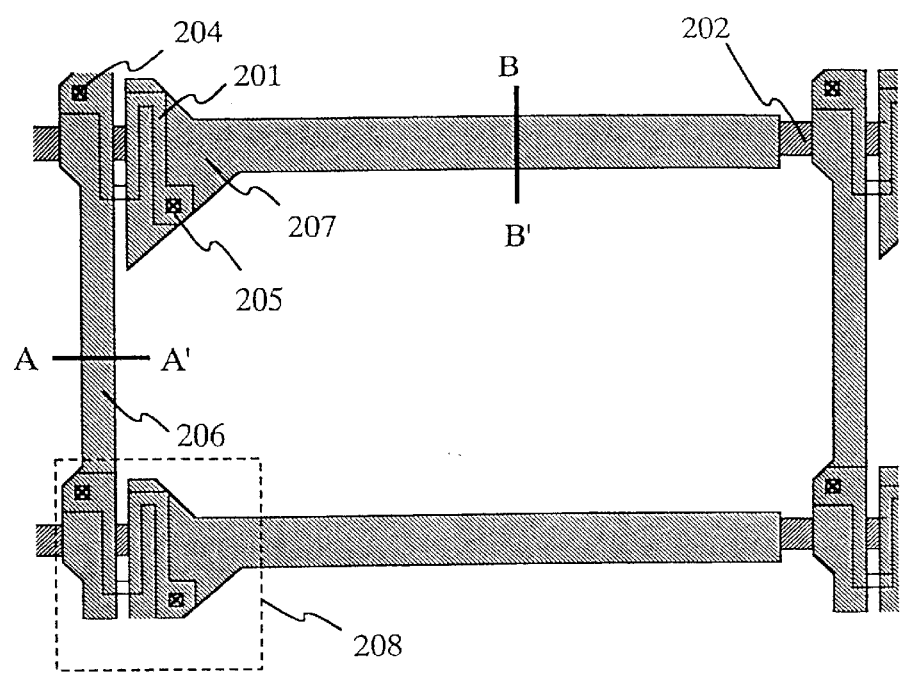
FIGS. 3A to 3C are views of manufacturing steps in embodiment 1.

Through the above manufacturing steps, a switching element (TFT) 208 for applying voltage for controlling a liquid crystal to a pixel electrode was completed. In the present specification, an element formed in a region denoted by 208 in FIG. 3A is called a switching element (typically a TFT, a MIM element may be used). In the present specification, a black mask, a pixel electrode, and the like formed thereafter are not contained in the structure of the switching element.

Next, steps of manufacturing an active matrix array substrate using the foregoing switching element will be described with reference to FIG. 3 to FIG. 6. Incidentally, FIG. 2D corresponds to FIG. 3A.

Figures 3B, 3C:
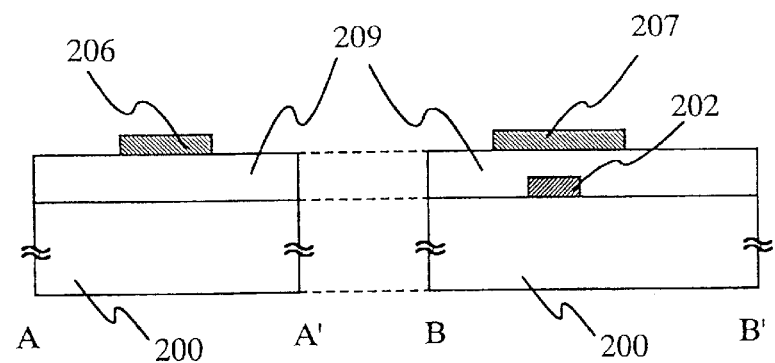

FIG. 3A is an enlarged top view showing one of pixels constituting a pixel matrix circuit of an active matrix type liquid crystal display device after the foregoing step in which the switching element 208 has been manufactured. FIG. 3B is a sectional structural view taken along A—A' in FIG. 3A, and FIG. 3C is a sectional structural view taken along B—B' in FIG. 3A.

In this embodiment, a first auxiliary capacitance 700 and a second auxiliary capacitance 500 are formed in the same pixel.

The first auxiliary capacitance is made up of a black mask, an inorganic layer on the black mask, and a pixel electrode. Manufacturing steps of the first auxiliary capacitance are shown in sectional structural views taken along A—A' and sectional structural views taken along B—B' in FIGS. 5 to 7. Although the auxiliary capacitance disclosed in the present specification indicates the first auxiliary capacitance, if it is used together with the second auxiliary capacitance, a sufficient capacitance can be secured and an effective pixel region can be increased.

The second auxiliary capacitance is made up of the black mask, an inorganic layer under the black mask, and a drain electrode. Manufacturing steps of the second auxiliary capacitance are shown in sectional structural views taken along line B—B' in FIGS. 3 to 5.

The steps of manufacturing the first auxiliary capacitance and the second auxiliary capacitance in the same pixel on the active matrix array substrate will be described below.

Figure 4A:
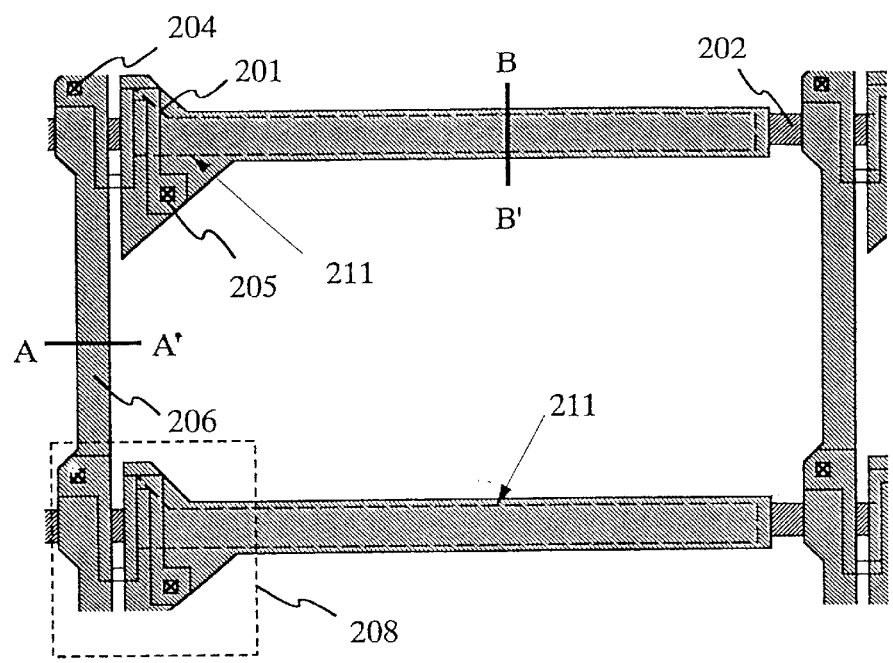
FIGS. 4A to 4C are views of manufacturing steps in embodiment 1.
Figures 4B, 4C:
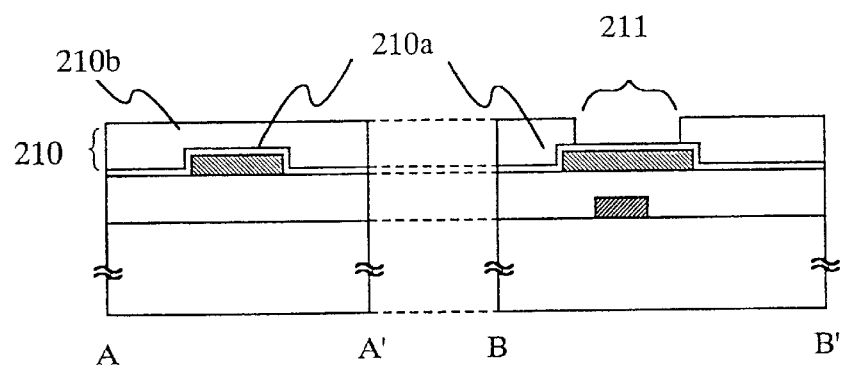

After the manufacturing steps of the switching element 208, as shown in FIGS. 4A to 4C, a second interlayer insulating film 210 was formed so as to cover the drain electrode 207 and a first interlayer insulating film 209, and an opening region 211 was formed at only a portion where the second auxiliary capacitance was formed later.

In this embodiment, as the second interlayer insulating film 210 (laminated film of an inorganic laminated film 210a and an organic resin film 210b), an insulating layer of laminated structure composed of a silicon nitride film (50 nm), a silicon oxide film (20 nm), and an acrylic film (1 µm) in the stated order from the bottom was used. As the organic resin film 210b, another organic resin material such as polyimide may be used instead of acryl. The second interlayer insulating film may be a single layer or laminated structure of two layers or more.

In order to form the opening region 211 shown in FIG. 4C, the acrylic film was opened by a dry etching method using a fluorine-based etchant. The region indicated by dotted lines in FIG. 4A shows the opening region 211. At this time, the silicon oxide film functions as an etching stopper. Thus, the inorganic laminated film 210a composed of the silicon nitride film and the silicon oxide film remained at the bottom of the opening region 211. In the case of this embodiment, this inorganic laminated film was used as a dielectric of the second auxiliary capacitance. Of course, it is also possible to make such a structure that the silicon oxide film is selectively removed by wet etching so that only the silicon nitride film is made to remain.

Although the laminated structure of silicon nitride film/silicon oxide film organic resin film is used as the second interlayer insulating film 210 in this embodiment, it is needless to say that as long as the uppermost layer is made of an organic resin, the present invention is not limited to this structure. In order to effectively carry out this embodiment, it is appropriate that a thin insulating film with as high relative dielectric constant as possible is provided as an under layer, and a thick insulating film with a low relative dielectric constant is provided thereon. That is, it is necessary to make such a structure that the film efficiently functions as the dielectric of the second auxiliary capacitance in the opening region 211 and effectively functions as an interlayer insulating film in regions other than the opening region.

In the case where the second interlayer insulating film 210 is made a single layer (organic resin film, etc.), a portion which is a thin film by forming an opening region by half etching may be used as the dielectric of the second auxiliary capacitance.

After the opening region 211 was formed in the organic resin film 210b in this way, a black mask film was formed. In this embodiment, as the black mask film, a film made of titanium with a thickness of 200 nm was formed by an RF sputtering method while heating titanium at 150° C. However, as a constituent material, chromium, tantalum, aluminum, titanium nitride, or the like may be suitably used. It is also possible to form the film by using an evaporation method. Although not shown, the black mask becomes one electrode of the auxiliary capacitance in a subsequent step, and is electrically connected to a lead wiring line formed at the same time as the source wiring line so as to keep its potential at 0 V.

Figure 5A:
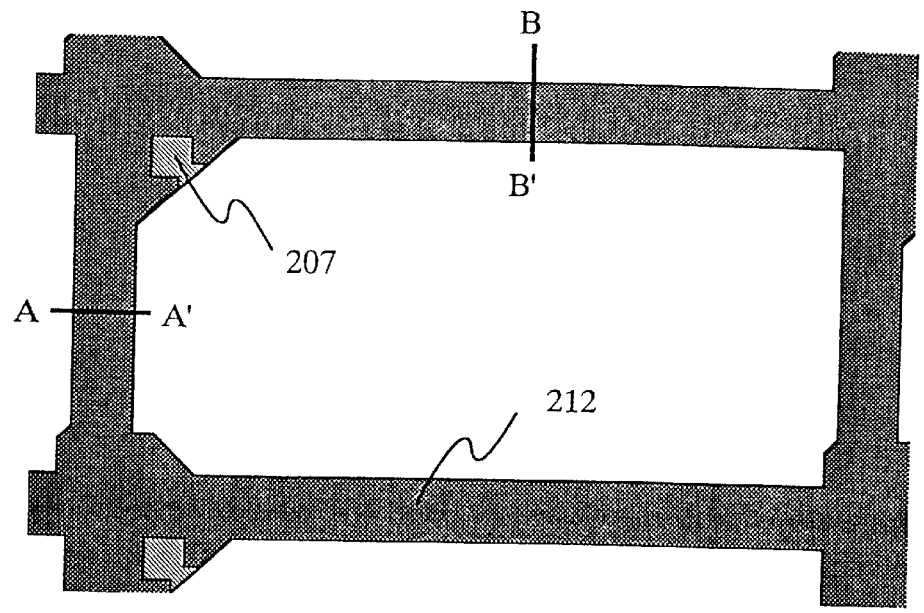
FIGS. 5A to 5C are views of manufacturing steps in embodiment 1.
Figures 5B, 5C:
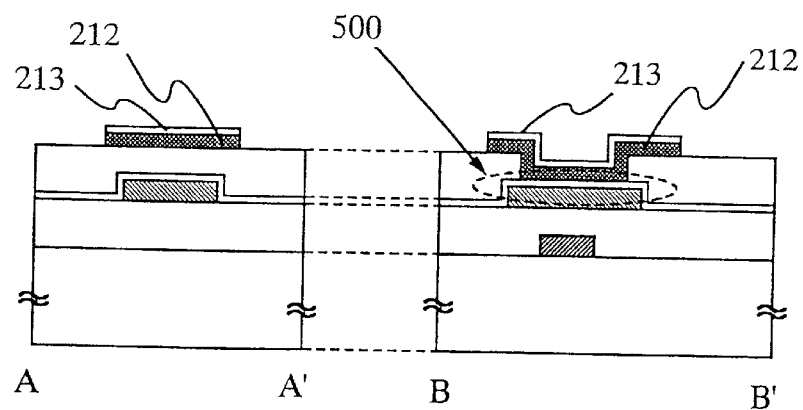

When the black mask film is subjected to a patterning step which is a subsequent step, as shown in FIG. 5C in which an example of sectional structural views is shown, it is possible to form the second auxiliary capacitance 500 including the drain electrode 207 and the black mask 212 as upper and lower electrodes, and the inorganic laminated film 210 (accurately the laminated film of silicon nitride/silicon oxide) as the dielectric.

Next, an inorganic film was formed on the black mask film. With respect to the inorganic film, its dielectric constant becomes important, and an amorphous silicon nitride film, an amorphous silicon oxide film, a silicon nitride oxide film ($SiO_xN_y$), a DLC (diamond like carbon) film, an aluminum oxide film, a tantalum oxide film, a titanium oxide film, a laminated film of these films, and the like may be used.

In the case where the silicon oxide film is used as the inorganic film, it is appropriate that $SiH_4$ or TEOS, and oxygen or ozone are used as a reaction gas in a plasma CVD method. In the case where the silicon nitride oxide film is used, it is appropriate that $SiH_4$ and $N_2O$ and/or $N_2$ is used as a reaction gas. In the case where the DLC film is used, it is appropriate that film formation is made by using sputtering of a carbon target in a hydrogen atmosphere, or by using an ion beam deposition method or ECR (electron cyclotron resonance) CVD method while using a reaction gas of hydrocarbon or hydrogen in addition to hydrocarbon. In the case where aluminum oxide, tantalum oxide, titanium oxide, or tantalum nitride (TaN) is used for the inorganic film, it is appropriate that film formation is made by using a sputter method.

When a crystalline coating film is used for the inorganic film, there is a high possibility that a pin hole or crack is produced by a crystal grain boundary so that inferior display or a blur is caused. Thus, an amorphous coating film with uniform film qualities is preferable as the inorganic film used for the storage capacitance. Accordingly, it is preferable to make the inorganic film amorphous by making the reaction pressure high and/or making the temperature low when the inorganic layer is formed.

In this embodiment, a silicon nitride film was formed as the inorganic film by using a plasma CVD method. In this embodiment, although a single layer structure of the silicon nitride film is used, it is needless to say that the present invention is not limited to this structure.

As conditions in this embodiment, $SiH_4$, $NH_3$, and $N_2$ with 5 sccm/38 sccm/87 sccm were used as a reactive gas, and the film with a thickness of 100 nm was formed at a reaction temperature of 250° C. Thereafter, a resist was provided on the inorganic film, patterning was carried out, and an inorganic layer 213 was formed by a dry etching method using a fluorine-based etchant. In addition, the black mask film was etched by using the same mask and by using a chlorine-based etchant (FIGS. 5A to 5C).

Next, an acrylic film with a thickness of 1 μm was formed as a third interlayer insulating film 214 on the inorganic layer. Of course, another insulating film such as a polyimide film may be formed. Moreover, the third interlayer insulating film may be a single layer or a laminated structure of two layers or more. If the third interlayer insulating film is made of the same material as the second interlayer insulating film, a stress can be suppressed and superior adhesiveness can be obtained. Further, when a contact hole is opened, since the etching rates of the films are equal to each other, the remains of etching can be decreased and poor contact can be suppressed.

The portion, where the first auxiliary capacitance was constituted later, was etched to provide an opening region 215 (FIGS. 6A to 6C).

In order to form the opening region 215, the acrylic film was opened by a dry etching method. In this embodiment, the region was formed by dry etching using $CF_4/O_2/He$ of 5 sccm/95 sccm/40 sccm. The region indicated by dotted lines in FIG. 6A shows the opening region 215. The silicon nitride film remained on the bottom of the opening region 215. In the case of this embodiment, this silicon nitride film was used as the dielectric of the first auxiliary capacitance.

Figure 7A:
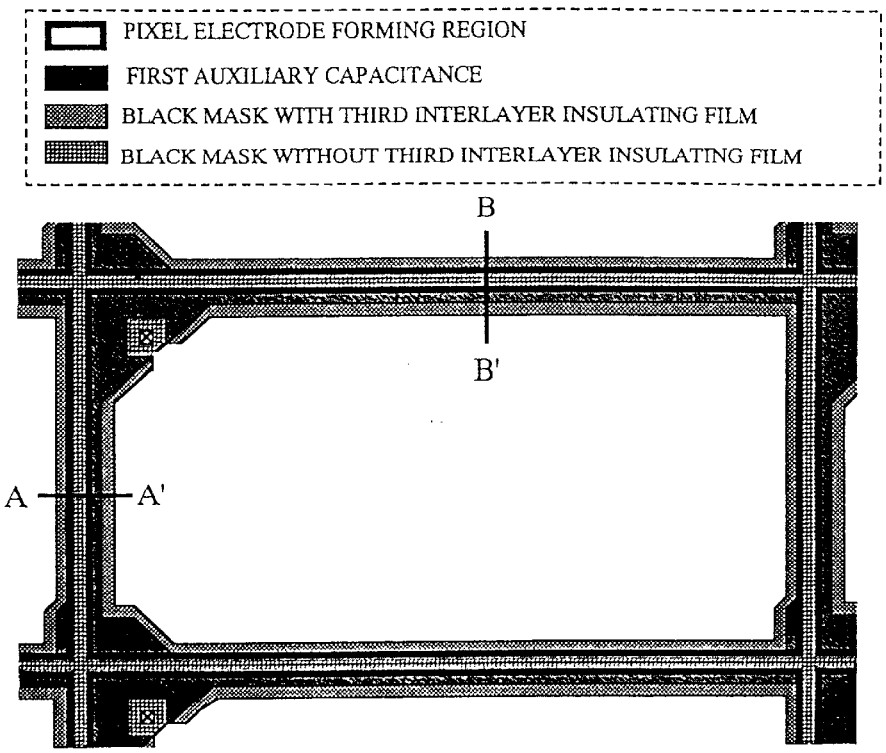
FIGS. 7A to 7C are views of manufacturing steps in embodiment 1.
Figures 7B, 7C:
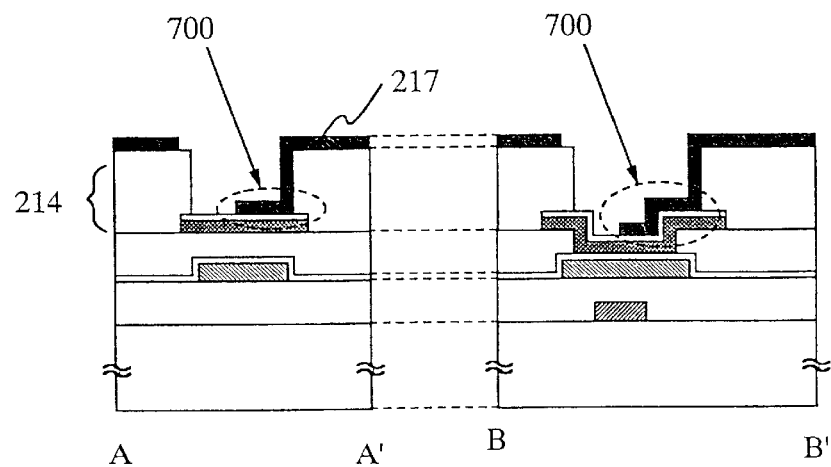

Then a contact hole 216 was formed by the same etching step as or different etching step from the formation of the opening region 215, and a transparent conductive film (typically an ITO film) which became a pixel electrode 217 was formed and was patterned (FIGS. 7A to 7C).

Although not shown in the sectional structural views (FIGS. 7B and 7C), the drain electrode 207 and the pixel electrode 217 were electrically connected to each other by using the contact hole 216. In this way, the pixel electrode was provided on the black mask 212 through the insulating layer.

Through the foregoing steps, the first auxiliary capacitance 700 including the pixel electrode 217 and the black mask 212 as upper and lower electrodes, and the inorganic layer 213 (accurately the silicon nitride film) as the dielectric was formed. The portion where a region indicated by a bold line in FIG. 7A overlaps with a region on the black mask where the third interlayer insulating film is not laminated, becomes a region where the first auxiliary capacitance (Cs) is formed. Thus, even if a gap occurs in the patterning step of the pixel electrode, the auxiliary capacitance (Cs) is hardly changed.

The first auxiliary capacitance 700 formed by using the black mask formed on the source wiring line is shown in FIG. 7B. The black mask is disposed to conceal each wiring line, switching element, and disclination. Thus, it is very effective to form the auxiliary capacitance by using this black mask in view of increasing an effective pixel region.

In addition, FIG. 7C shows the first auxiliary capacitance (pixel electrode/inorganic layer/black mask) formed by using the black mask formed on the gate wiring line. In FIG. 7C, the second auxiliary capacitance (black mask/inorganic layer drain electrode) is also formed, so that more sufficient capacitance can be obtained and the effective pixel region can be increased.

It is needless to say that at the end of the black mask shown in FIGS. 7B and 7C, even in a portion where the third interlayer insulating film is laminated, an auxiliary capacitance (pixel electrode/third interlayer insulating film and inorganic layer/black mask) is formed.

As shown in FIGS. 7A to 7C, since the portion where the first auxiliary capacitance is formed has a recess portion, disclination occurs at that portion. Thus, this structure is effective since disclination is intentionally concentrated on the black mask.

Incidentally, it is needless to say that the present invention is not limited to the arrangement of pixels viewed from the above in FIG. 7A. Although FIG. 7B and FIG. 7C show the drain electrode, the source wiring line, and the gate wiring line, the present invention is not particularly limited to this structure.

After the pixel structure is completed in this way, hydrogenating is carried out so that dangling bonds remaining in the active layer of the TFT are terminated with hydrogen. Further, an orientation film covering the pixel electrode was formed. The orientation film is made to have orientation force by rubbing.

Through the above manufacturing steps, a plurality of pixels were formed and an active matrix substrate including a pixel matrix circuit was completed. It is appropriate that at least one switching element and first auxiliary capacitance are disposed for each of the pixels in the pixel matrix circuit.

It is also possible to form on the active matrix substrate a driving circuit (driver circuit) or a signal processing circuit (γ correction circuit, or logic circuit such as a D/A converter) other than the pixel matrix circuit. Since the manufacturing steps of these circuits are substantially the same (actually, they are completed at the step of FIG. 1D) as the manufacturing steps shown in this embodiment, their detailed description will be omitted.

Since the present invention relates to the structure of arrangement of pixels, any structure may be adopted for other circuits (foregoing driving circuit or logic circuit) formed over the same substrate. Manufacturing steps and structures of such circuits may be suitably determined by an operator.

Although a transmission type LCD using the transparent conductive film as the pixel electrode is shown as an example in this embodiment, a reflection type LCD can be easily manufactured by using a reflective electrode as the pixel electrode.

[Embodiment 2]

In this embodiment, an example in which instead of the inorganic layer 213 (silicon nitride film of a single layer) of the embodiment 1, a laminated structure of a silicon nitride film and a silicon oxide film is used, will be described with reference to FIGS. 8A and 8B. Since steps other than a step of forming an inorganic layer are the same as the embodiment 1, their explanation will be omitted. Since the same mask as the embodiment 1 is used, the top view is the same as FIG. 7A. Of course, this embodiment is not limited to this mask shape.

In this embodiment, a silicon nitride film (50 nm) was used as a first inorganic layer, and a silicon oxide film (20 nm) was used as a second inorganic layer.

The silicon oxide film has high insulating properties and low leak current. Thus, high reliability against short-circuiting or the like can be obtained, and it was effective to use the film as an insulating film of an auxiliary capacitance. Especially, as in this embodiment, when the silicon oxide film was used as the uppermost layer at the time when the inorganic layer was made a multi-layer structure, it was possible to make the film an etching stopper in the case where a dry etching method was used, so that the film was useful.

Figure 8A:
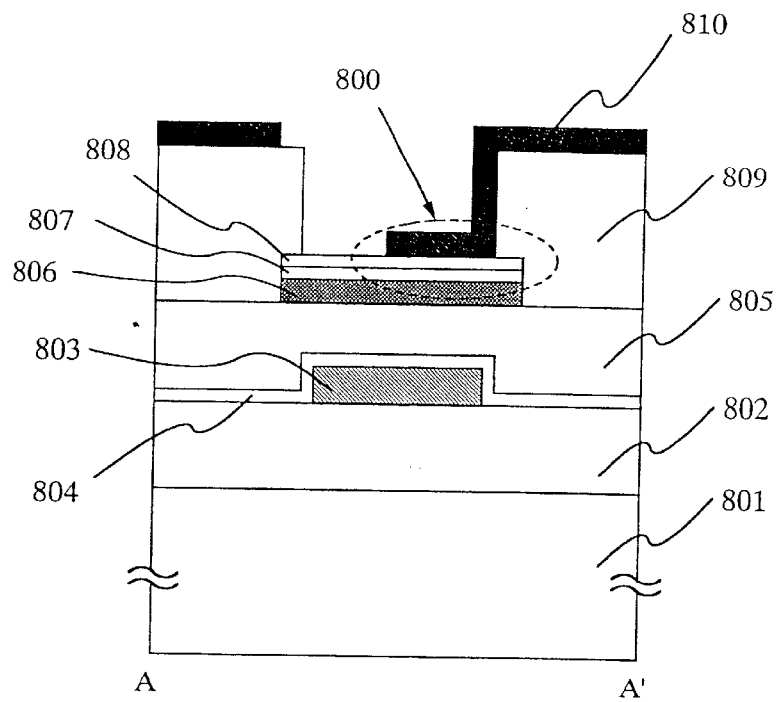
FIGS. 8A and 8B are sectional structural views of a pixel in embodiment 2.
Figure 8B:
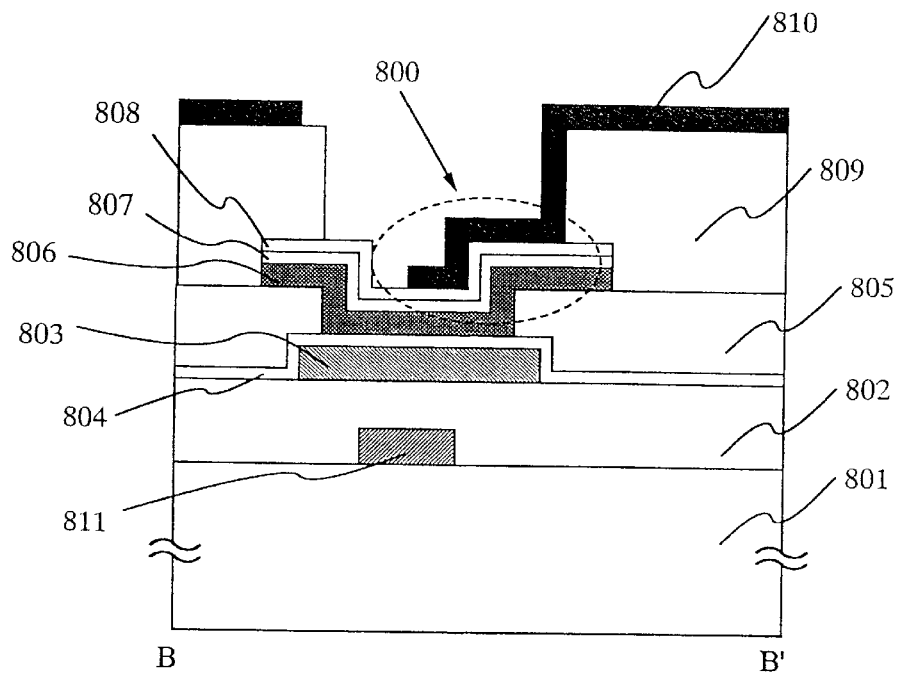

FIGS. 8A and 8B show sectional structures of a first auxiliary capacitance 800 in the embodiment 2. In FIGS. 8A and 8B, reference numeral 801 denotes a substrate having an insulating surface, 802 denotes a first interlayer insulating film, 803 denotes a source wiring line, 804 denotes an inorganic laminated film, 805 denotes a second interlayer insulating film, 806 denotes a black mask, 807 denotes a first inorganic layer, 808 denotes a second inorganic layer, 809 denotes a third interlayer insulating film, and 810 denotes a pixel electrode.

[Embodiment 3]

In this embodiment, an example in which in the above embodiment 2, after the second inorganic layer (silicon oxide film) is used as a stopper of dry etching, the layer is selectively removed by wet etching, so that only the silicon nitride film is used as a dielectric, will be described with reference to FIG. 9B. Since steps up to the step (FIG. 9A) of laminating the silicon nitride film and the silicon oxide film are the same as the embodiment 2, their description will be omitted. Since the same mask as the embodiment 1 is used, the top view is the same as FIG. 7A. Of course, this embodiment is not limited to this mask shape.

In this embodiment, after the selective removal by wet etching was carried out and only the silicon nitride film was made to remain as the dielectric, similarly to the embodiment 1, formation of a third interlayer insulating film and a pixel electrode was carried out.

After the pixel structure was completed in this way, hydrogenating was carried out so that dangling bonds remaining in the active layer of a TFT were terminated with hydrogen. Further, an orientation film covering the pixel electrode was formed. The orientation film was made to have orientation force by rubbing. An active matrix array substrate was completed in this way.

Figure 9A:
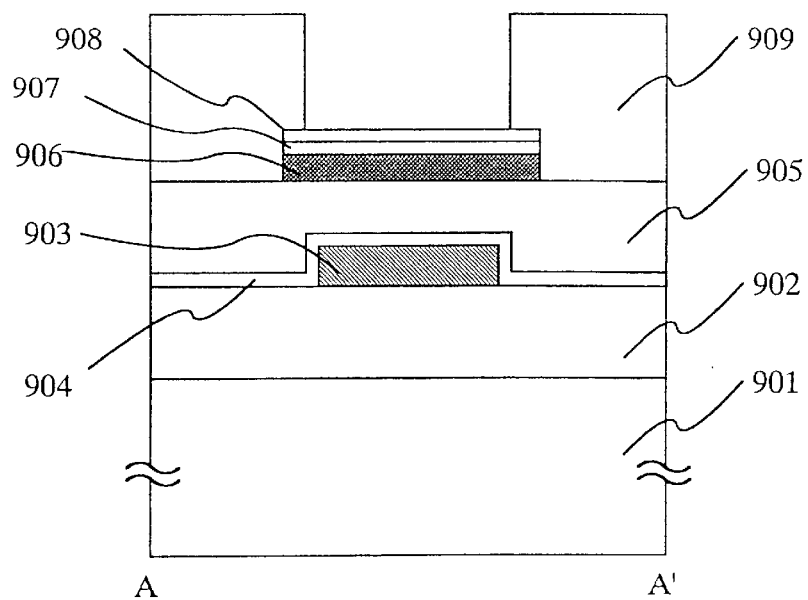
FIGS. 9A and 9B are views of manufacturing steps in embodiment 3.
Figure 9B:
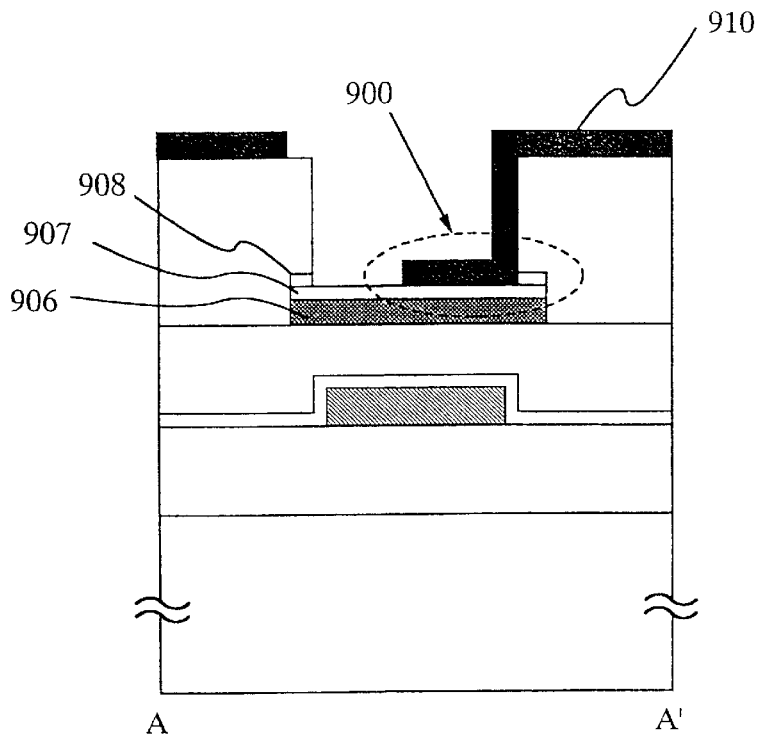

FIG. 9B shows a sectional structure of an auxiliary capacitance 900 in this embodiment 3. In FIGS. 9A and 9B, reference numeral 901 denotes a substrate having an insulating surface, 902 denotes a first interlayer insulating film, 903 denotes a source wiring line, 904 denotes an inorganic laminated film, 905 denotes a second interlayer insulating film, 906 denotes a black mask, 907 denotes a first inorganic layer, 908 denotes a second inorganic layer, 909 denotes a third interlayer insulating film, and 910 denotes a pixel electrode.

As compared with the embodiment 2, although the number of steps in this embodiment was increased, since only the silicon nitride film was used as the dielectric, it was possible to obtain a sufficient capacitance.

[Embodiment 4]

In this embodiment, an example in which an anodic oxidation film of a black mask is used as the inorganic layer of the embodiment 1, will be described with reference to FIGS. 10A and 10B. Since steps up to a step of obtaining a TFT and a first interlayer insulating film are the same as the embodiment 1, their explanation will be omitted. Since the same mask as the embodiment 1 is used, the top view is the same as that of FIG. 7A. Of course, this embodiment is not limited to this mask shape.

In the case where Al or Ta is used for the black mask film, if $Al_2O_3$ or $Ta_2O_5$ is formed on the surface by carrying out anodic oxidation, the inorganic layer having a large dielectric constant can lessen peeling generated by stress to the black mask, and can be formed in a self-aligning manner, so that it is effective. Further, it was able to further reduce poor display occurred due to particles or the like. In this embodiment, Ta (150 nm) was used for the black mask film.

Next, a resist was provided on the black mask film, and anisotropic dry etching was applied to the black mask film by using a fluorine-based etchant. The black mask was art formed by this step.

Thereafter, the resist was removed, and anodic oxidation was carried out. Anodic oxidation using the black mask as an anode and an ammonium phosphate solution as an electrolyte was carried out so that an anodic oxidation film of $Ta_2O_5$ with a thickness of 70 to 300 nm, in this embodiment, 150 nm was formed. As the electrolyte, a solution containing organic acid of malonic acid, etc., ammonium tartrate, ammonium phosphate, ammonium borate, or the like can be used. This anodic oxidation is not particularly limited as long as it is a generally used anodic oxidation step.

In this embodiment, although anodic oxidation is carried out after the black mask film is patterned, anodic oxidation may be carried out before patterning so that an anodic oxidation film is formed on the whole surface. Especially, when the inorganic layer is made a laminated structure of the anodic oxidation film and another inorganic layer, it is necessary to carry out anodic oxidation before patterning to form the anodic oxidation film on the whole surface, and then, another inorganic layer, for example, a silicon oxide film is formed.

Next, an acrylic film was formed as a third interlayer insulating film. The acrylic film with a thickness of 0.2 to 0.7 $\mu$m, in this embodiment, a film thickness of 0.3 $\mu$m was formed by using a spinner and then, was burned to complete the film.

After this step, selective etching of the third interlayer insulating film, formation of a contact hole, patterning of a pixel electrode, hydrogenating, and formation of an orientation film were carried out, so that the active matrix array substrate was completed. As a result, the structure (auxiliary capacitance 1000) shown in FIGS. 10(1) and 10(2) was obtained. The top view is the same as that of FIG. 7A.

Figure 10A:
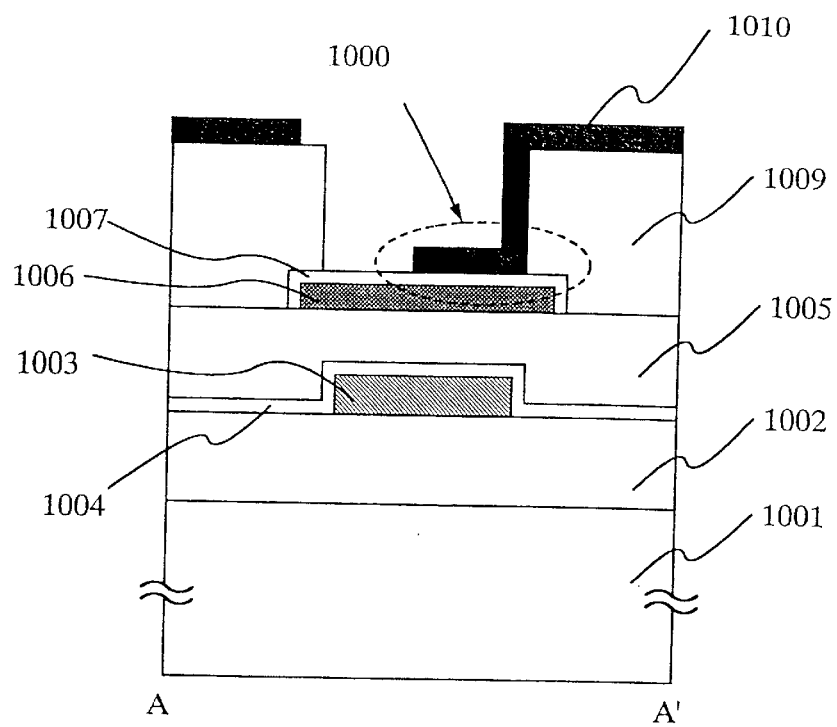
FIGS. 10A and 10A are sectional structural views of a pixel in embodiment 4.
Figure 10B:
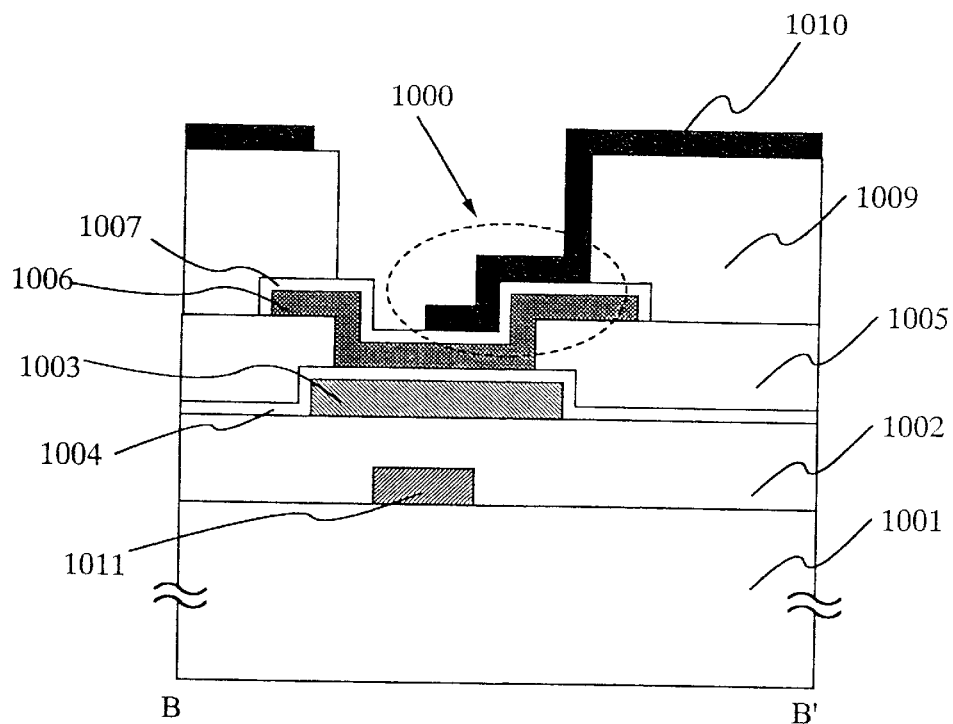

FIGS. 10A and 10B show sectional structures of the auxiliary capacitance 1000 in FIG. 7A. In FIGS. 10A and 10B, reference numeral 1001 denotes a substrate having an insulating surface, 1002 denotes a first interlayer insulating film, 1003 denotes a source wiring line, 1004 denotes an inorganic laminated film, 1005 denotes a second interlayer insulating film, 1006 denotes a black mask, 1007 denotes an anodic oxidation film, 1009 denotes a third interlayer insulating film, and 1010 denotes a pixel electrode.

[Embodiment 5]

In this embodiment, an example in which the third interlayer insulating film is not formed in the above embodiment 4, will be described with reference to FIGS. 11A and 11B. Since steps up to a step of forming a black mask film are the same as the embodiment 4, their explanation will be omitted. Since the same mask as the embodiment 1 is used, the top view is the same as that of FIG. 7A. Of course, this embodiment is not limited to this mask shape.

In this embodiment, a resist was provided on the black mask film, and anisotropic dry etching was excessively applied to the black mask film by using a fluorine-based etchant. By this step, the edge of the black mask (Ta) was intentionally made taper-shaped.

Thereafter, the resist was removed and anodic oxidation was carried out. Anodic oxidation using the black mask as an anode and an ammonium phosphate solution as an electrolyte was carried out so that an anodic oxidation film of $Ta_2O_5$ with a thickness of 70 to 300 nm, in this embodiment, 100 nm was formed. As the electrolyte, a solution containing organic acid of malonic acid, etc., ammonium tartrate, ammonium phosphate, ammonium borate, or the like can be used. This anodic oxidation is not particularly limited as long as it is a generally used anodic oxidation step.

Figure 11A:
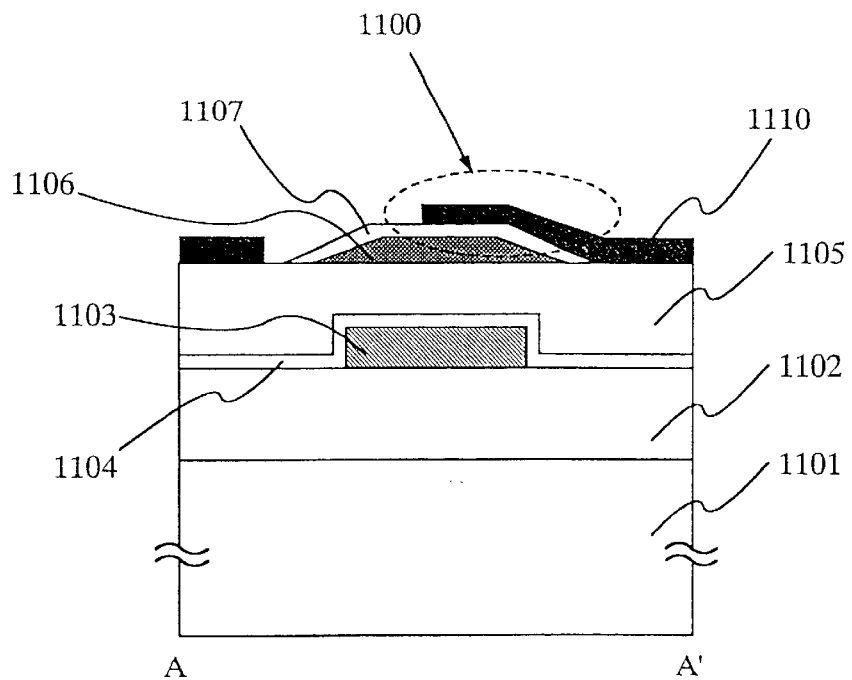
FIGS. 11A and 11B are sectional structural views of pixels in embodiment 5.

Then a contact hole was formed by an etching step, and a transparent conductive film (typically an ITO film) which became a pixel electrode 1110 was formed and was patterned (FIG. 11A).

After the pixel structure was completed in this way, hydrogenating was carried out so that dangling bonds remaining in the active layer of a TFT were terminated with hydrogen. Further, an orientation film covering the pixel electrode was formed. The orientation film is made to have orientation force by rubbing. An active matrix array substrate was completed in this way. As a result, the structure (auxiliary capacitance 1100) shown in FIG. 11A was obtained.

In the structure of this embodiment, as compared with the above respective embodiments, since the third interlayer insulating film was not formed, formation of the contact hole was easy. Moreover, the edge of the black mask was intentionally made taper-shaped (preferably, a taper angle was 20° or less), so that even if the interlayer insulating film was not formed, sufficient flatness was obtained. Ta used in this embodiment is a material in which the edge can be easily made taper-shaped as compared with other valve metals.

Figure 11B:
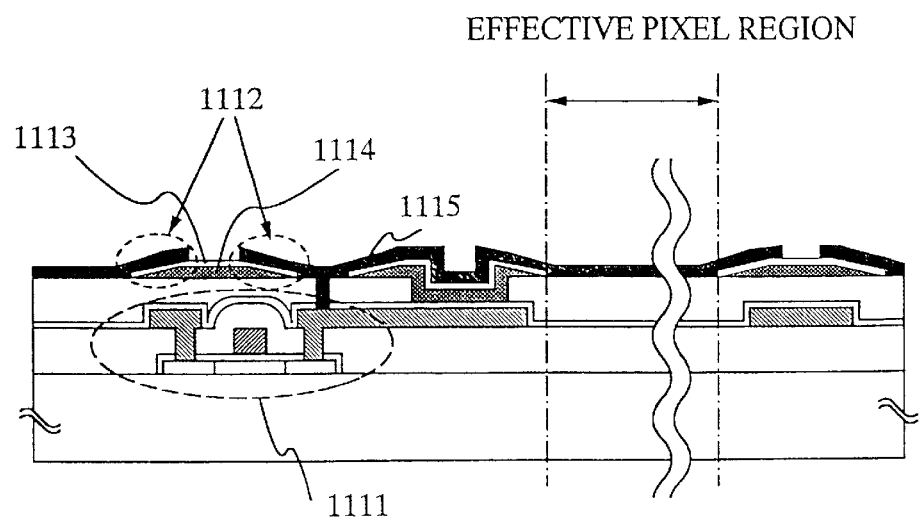

As an applied example of this embodiment, FIG. 11B shows a sectional view of an active matrix type display device including an element portion 1111 under an auxiliary capacitance 1112. Similarly, the auxiliary capacitance. 1112 is made up of an anodic oxidation film 1113 as a dielectric, a black mask 1114, and a pixel electrode 1115.

[Embodiment 6]

In the embodiment 2, there has been described a case where the laminated layer of the silicon nitride film and the silicon oxide film is used as an example of an inorganic layer. In embodiment 6, an example in which a DLC (diamond-like carbon) film is used as an under layer of an inorganic layer made of multi-layer structure, will be described below. Since the same mask as the embodiment 1 is used, the top view is the same as that of FIG. 7A. Of course, this embodiment is not limited to this mask shape.

There was used a structure in which a DLC film having a large dielectric constant was first formed on a black mask film, and an upper layer made of a silicon nitride film, a silicon oxide film, or a silicon nitride oxide film was provided thereon.

By adopting such a structure, after the upper layer was selectively etched with a chlorine-based etchant, the DLC film was etched with an oxygen-based etchant. By this etching, it was also possible to carry out ashing of the resist at the same time, and it was possible to obtain a patterned inorganic layer by a fewer steps as compared with other multi-layer structures.

[Embodiment 7]

Figure 12A:
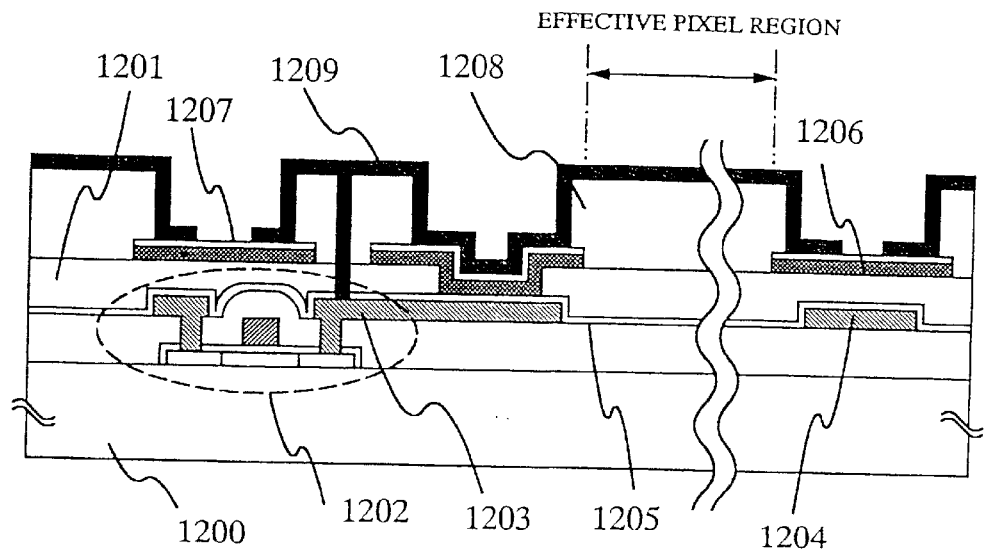
FIGS. 12A and 12B are sectional structural views of pixels in embodiment 7.
Figure 12B:
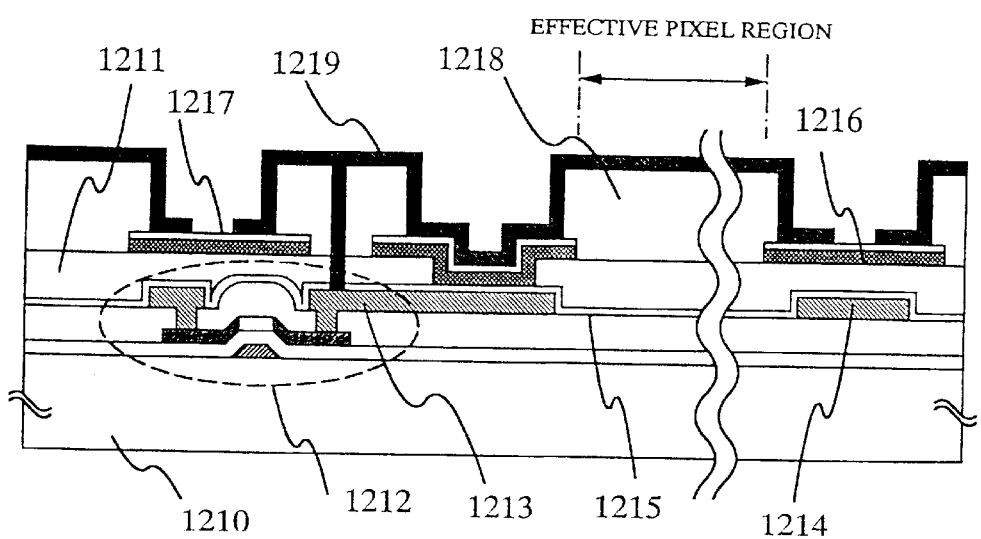

Although the embodiment 1 shows an example in which a planar type TFT is manufactured as an example of a top gate structure, a bottom gate type TFT (typically, an inverted stagger type TFT) may be used as a switching element of a pixel. FIG. 12A is a sectional structural view showing an active matrix array substrate using a typical planar type TFT 1202. FIG. 12B is a sectional structural view showing an active matrix array substrate using a bottom gate type TFT 1212. In FIGS. 12A and 12B, reference numerals 1200 and 1210 denote substrates, 1201 and 1211 denote second interlayer insulating films, 1203 and 1213 denote drain electrodes, 1204 and 1214 denote source wiring lines, 1205 and 1215 denote protective films, 1206 and 1216 denote black masks, 1207 and 1217 denote inorganic layers, 1208 and 1218 denote third interlayer insulating films, and 1209 and 1219 denotes pixel electrodes.

Of course, even in the case where the inverted stagger type TFT is used, it is possible to adopt the structure of the embodiments 1 to 6.

[Embodiment 8]

Figure 13:
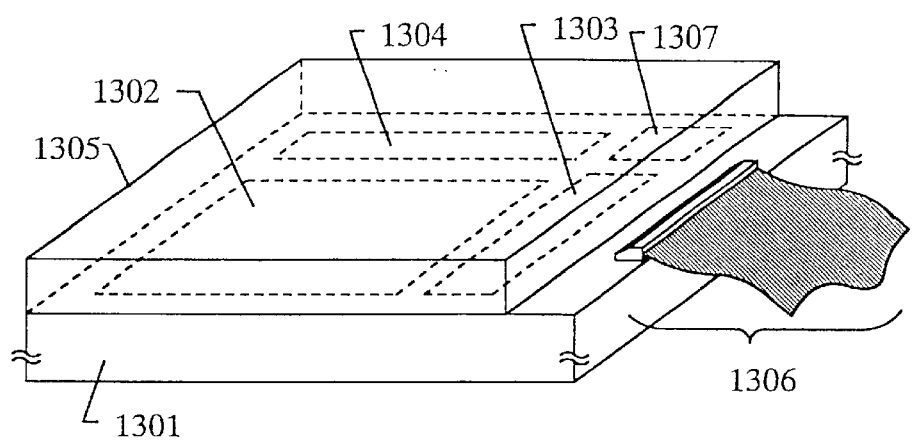
FIG. 13 is a view showing a structure of an AMLCD in embodiment 8.

In this embodiment, an example in which an AMLCD is constituted by using an active matrix array substrate (an element formation side substrate) of the structure shown in the respective embodiments 1 to 7 will be described. FIG. 13 shows the external appearance of the AMLCD of this embodiment.

In FIG. 13, reference numeral 1301 denotes an active matrix array substrate. A pixel matrix circuit 1302, a source side driving circuit 1303, and a gate side driving circuit 1304 are formed thereon. It is preferable to form the driving circuit with a CMOS circuit in which an N-type TFT and a P-type TFT are complementarily combined. Signal processing is carried out by a logic circuit 1307 formed of TFTs on the same substrate. Reference numeral 1305 denotes an opposite substrate.

In the AMLCD shown in FIG. 13, the active matrix array substrate 1301 is bonded to the opposite substrate 1305 and their end surfaces are made flush with each other. However, only a part of the opposite substrate 1305 is removed and an FPC (Flexible Print Circuit) 1306 is connected to the exposed active matrix type substrate. An external signal is transmitted to an internal circuit through this FPC 1306.

Although the AMLCD of this embodiment adopts the structure (BM on TFT) in which the black mask is provided on the active matrix substrate, it is also possible to make such a structure that a black mask is provided on the opposite side.

Color display may be made by using color filters, or a structure in which a liquid crystal is driven by an ECB (Electric Control Birefringence) mode, GH (Guest Host) mode or the like so that color filters are not used, may be adopted.

Like a technique disclosed in Japanese Patent Application Laid-open No. Hei 8-15686, a structure in which a microlens array is used, may be adopted.

[Embodiment 9]

The AMLCD shown in the embodiment 8 is used for a display of various electronic apparatus. Incidentally, the electronic apparatus set forth in this embodiment is defined as a product incorporating an active matrix type liquid crystal display device.

As such electronic apparatus, a video camera, a still camera, a projector, a projection TV, a head mount display, a car navigation system, a personal computer (including a note-sized computer), a portable information terminal (mobile computer, portable telephone, etc.) and the like are enumerated. Of those, one example will be shown in FIGS. 14A to 14F.

Figure 14A:
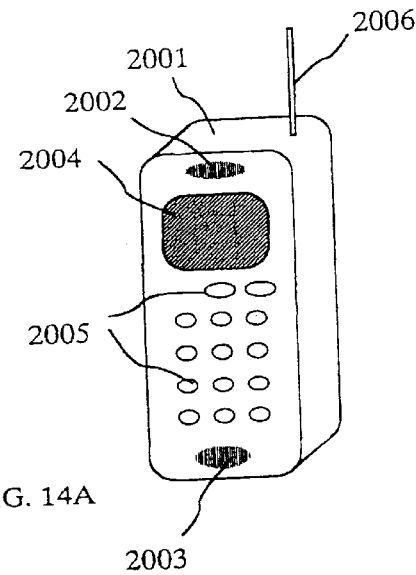
FIGS. 14A to 14F are views showing electronic equipments each incorporating an AMLCD in embodiment 9.

FIG. 14A shows a portable telephone which is constituted by a main body 2001, an audio output portion 2002, an audio input portion 2003, a display device 2004, an operation switch 2005, and an antenna 2006. The present invention can be applied to the display device 2004 and the like.

Figure 14B:
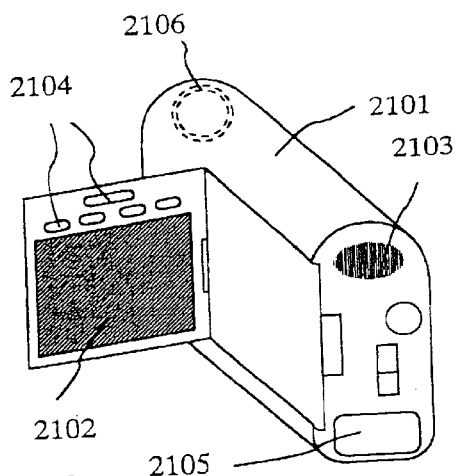

FIG. 14B shows a video camera which is constituted by a main body 2101, a display device 2102, an audio input portion 2103, an operation switch 2104, a battery 2105, and an image receiving portion 2106. The present invention can be applied to the display device 2102.

Figure 14C:
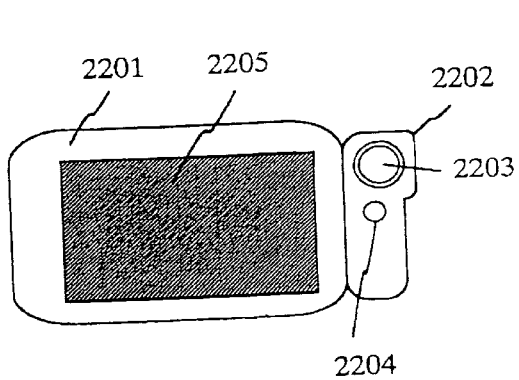

FIG. 14C shows a mobile computer which is constituted by a main body 2201, a camera portion 2202, an image receiving portion 2203, an operation switch 2204, and a display device 2205. The present invention can be applied to the display device 2205 and the like.

Figure 14D:
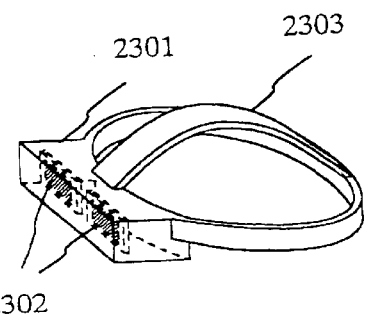

FIG. 14D shows a head mount display which is constituted by a main body 2301, a display device 2302, and a band portion 2303. The present invention can be applied to the display device 2302.

Figure 14E:
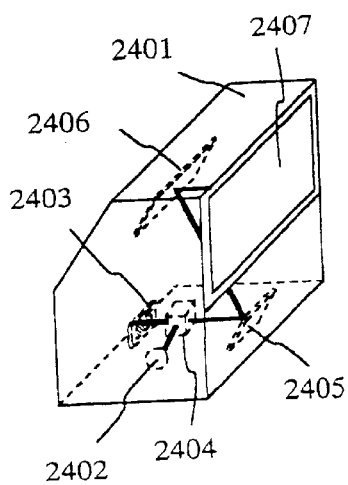

FIG. 14E shows a rear type projector which is constituted by a main body 2401, a light source 2402, a display device 2403, a polarizing beam splitter 2404, reflectors 2405 and 2406, and a screen 2407. The present invention can be applied to the display device 2403.

Figure 14F:
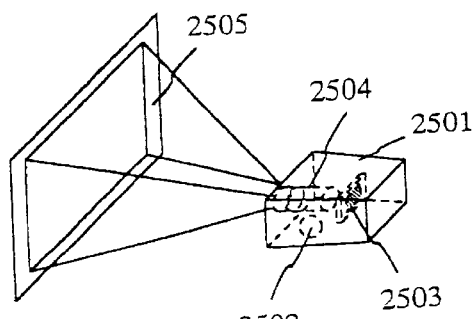

FIG. 14F shows a front type projector which is constituted by a main body 2501, a light source 2502, a display device 2503, an optical system 2504, and a screen 2505. The present invention can be applied to the display device 2503.

As set forth above, the scope of application of the present invention is extremely wide and the present invention can be applied to electronic apparatus of any field. Moreover, the present invention can also be applied to a video billboard, a display for advertisement, and the like.

As described above, the present invention relates to the structure of each pixel constituting a pixel matrix circuit of an AMLCD.

The black mask in the structure of the pixel of the present invention protects a wiring line and a switching element against an electromagnetic wave, light or the like, which causes poor display and deterioration of element characteristics, and functions as an electrode forming an auxiliary capacitance.

Even if a positional gap occurs in a patterning step of a pixel electrode, the auxiliary capacitance is hardly changed, so that dispersion in capacitance of respective pixels can be eliminated.

By carrying out the present invention, roughness is intentionally formed, generating position of disclination generated in the pixel is controlled, and an occupied area of the black mask effectively concealing the disclination can be reduced.

According to the structure of the present invention, an effective pixel region in each pixel, that is, an effective pixel area is greatly enlarged, and a substantial picture display region is increased. Then, even in a finer LCD display, high contrast can be realized.

What is claimed is:

1. A method of manufacturing an active matrix type display device, said method comprising the steps of:

forming at least an inverted stagger thin film transistor on an insulating surface;

forming a first interlayer insulating film to cover the inverted stagger thin film transistor;

forming a second interlayer insulating film to cover the first interlayer insulating film;

forming at least a black mask to cover the second interlayer insulating film;

forming an inorganic layer to cover the black mask;

selectively removing the black mask and the inorganic layer;

forming a third interlayer insulating film to cover the black mask and the inorganic layer;

selectively removing the third interlayer insulating film to expose a portion of the inorganic layer; and forming a transparent conductive film to cover the third interlayer insulating film, wherein an auxiliary capacitance is formed between the black mask and the transparent conductive film with the portion of the inorganic layer interposed therebetween.

2. A method according to claim 1, wherein the inorganic layer comprises at least one selected from the group consisting of a silicon nitride film, a silicon oxide film, a silicon nitride oxide film, a DLC (diamond-like carbon) film, an aluminum oxide film, a tantalum oxide film, and a titanium oxide film.

3. A method according to claim 1, wherein the inorganic layer comprises an anodic oxide film of the black mask including a valve metal.

4. A method according to claim 1, wherein the black mask is formed on the second interlayer insulating film including an organic resin.

5. A method according to claim 1, wherein the active matrix type display device is used in an apparatus selected from the group consisting of a video camera, a still camera, a projector, a projection TV, a head mount display, a car navigation system, a personal computer and a portable information terminal.

6. A method of manufacturing an active matrix type display device, said method comprising the steps of:

forming an inverted stagger thin film transistor on an insulating surface;

forming a first interlayer insulating film to cover the inverted stagger thin film transistor;

forming a second interlayer insulating film to cover the first interlayer insulating film;

forming a black mask including a valve metal to cover the second interlayer insulating film;

selectively removing the black mask;

forming an inorganic layer by anodic oxidation of the black mask; and forming a transparent conductive film to cover the inorganic layer, wherein an auxiliary capacitance is formed between the black mask and the transparent conductive film with the inorganic layer therebetween.

7. A method according to claim 6, wherein an edge of the black mask is formed into a taper shape.

8. A method according to claim 6, wherein the black mask is formed on the second interlayer insulating film including an organic resin.

9. A method according to claim 6, wherein the active matrix type display device is used in an apparatus selected from the group consisting of a video camera, a still camera, a projector, a projection TV, a head mount display, a car navigation system, a personal computer and a portable information terminal.

10. A method of manufacturing an active matrix type display device, said method comprising the steps of:

forming at least a thin film transistor over a substrate having an insulating surface;

forming a first interlayer insulating film to cover said thin film transistor;

forming a second interlayer insulating film to cover said first interlayer insulating film;

forming at least a black mask to cover said second interlayer insulating film;

forming an inorganic layer to cover said black mask;

selectively removing said black mask and said inorganic layer;

forming a third interlayer insulating film to cover said black mask and said inorganic layer;

selectively removing said third interlayer insulating film to expose a portion of said inorganic layer; and forming a transparent conductive film to cover said third interlayer insulating film, wherein an auxiliary capacitance is formed between said black mask and said transparent conductive film with the portion of said inorganic layer interposed therebetween.

11. A method according to claim 10, wherein said inorganic layer comprises at least one selected from the group consisting of a silicon nitride film, a silicon oxide film, a silicon nitride oxide film, a DLC (diamond-like carbon) film, an aluminum oxide film, a tantalum oxide film, and a titanium oxide film.

12. A method according to claim 10, wherein said inorganic layer comprises an anodic oxide film of said black mask including a valve metal.

13. A method according to claim 10, wherein said black mask is formed on said second interlayer insulating film including an organic resin.

14. A method according to claim 10, wherein said active matrix type display device is used in an apparatus selected from the group consisting of a video camera, a still camera, a projector, a projection TV, a head mount display, a car navigation system, a personal computer and a portable information terminal.

15. A method according to claim 10, wherein said thin film transistor is a top gate type thin film transistor.

* * * * *